United States Patent [19]
Hagood, IV et al.

[11] Patent Number: 5,869,189
[45] Date of Patent: Feb. 9, 1999

[54] COMPOSITES FOR STRUCTURAL CONTROL

[75] Inventors: Nesbitt W. Hagood, IV, Wellesley; Aaron A. Bent, Allston, both of Mass.

[73] Assignee: Massachusetts Institute of Technology, Cambridge, Mass.

[21] Appl. No.: 687,827

[22] Filed: Jul. 26, 1996

Related U.S. Application Data

[63] Continuation of Ser. No. 229,574, Apr. 19, 1994, abandoned.

[51] Int. Cl.$^6$ .............................. B32B 15/08; H01L 41/04
[52] U.S. Cl. ......................... 428/461; 428/689; 428/692; 310/357; 310/358
[58] Field of Search ................................... 428/461, 689, 428/692; 310/357, 358

[56] References Cited

U.S. PATENT DOCUMENTS

| | | | |
|---|---|---|---|
| 4,330,730 | 5/1982 | Kurz et al. ............................... | 310/331 |
| 4,400,642 | 8/1983 | Kiraly ...................................... | 310/332 |
| 4,407,054 | 10/1983 | Zipfel, Jr. ................................ | 29/25.35 |
| 4,565,940 | 1/1986 | Hubbard, Jr. ............................ | 310/326 |
| 4,613,784 | 9/1986 | Haun et al. .............................. | 310/358 |
| 4,626,730 | 12/1986 | Hubbard, Jr. ............................ | 310/326 |
| 4,849,668 | 7/1989 | Crawley et al. ......................... | 310/328 |
| 4,868,447 | 9/1989 | Lee et al. ................................. | 310/328 |
| 4,868,566 | 9/1989 | Strobel et al. ........................ | 340/870.3 |
| 4,933,230 | 6/1990 | Card et al. . | |
| 4,958,100 | 9/1990 | Crawley et al. ......................... | 310/328 |
| 5,083,466 | 1/1992 | Holm-Kennedy et al. ........... | 73/862.04 |
| 5,095,762 | 3/1992 | Holm-Kennedy et al. ........... | 73/862.04 |
| 5,101,669 | 4/1992 | Holm-Kennedy et al. ........... | 73/862.64 |
| 5,220,296 | 6/1993 | von Flotow et al. .................. | 333/24 R |
| 5,291,090 | 3/1994 | Dias ......................................... | 310/334 |
| 5,340,510 | 8/1994 | Bowen ..................................... | 264/22 |
| 5,656,882 | 8/1997 | Lazarus et al. . | |

FOREIGN PATENT DOCUMENTS

WO91/12953  9/1991  WIPO .

OTHER PUBLICATIONS

Wetherhold, R.C. et al., "Piezoelectric PZT/epoxy composites for sensing and actuating torsional motion", Proceedings of SPIE Smart Structures and Materials Conference, vol. 1916, pp. 266–274, Albuquerque, NM, Feb. 1993.

Bent, A.A. et al., "Anistropic Actuation with Piezoelectric Fiber Composites", Presented at the Fourth International Conference on Adaptive Structures, Nov. 2–4, 1993, Cologne, Germany, pp. 1–16.

Hagood N.W. et al., "Development of Piezoelectric Fiber Composites for Structural Actuation", Presented at 34th AIAA/ASME/ASCE/AHS/ASC Structures, Structural Dynamics and Materials Conference, Apr. 1993, pp. 1–15.

Newnham, R.E., "Composite Electroceramics", Ferroelectrics, 1986, vol. 68, pp. 1–32.

Waller, D.J. et al., "Lead Zirconate Titanate Fiber/Polymer Composites Prepared by a Replication Process", J. Am. Ceram. Soc., vol. 73, No. 11, Nov. 1990, pp. 3503–3506.

Safari, A. et al., "Composite Piezoelectric Sensors", Materials Science Research, vol. 20, 1985, pp. 445–454.

Barrett, R., "Active Plate and Wing Research Using EDAP Elements", Smart Mater. Struct., vol. 1, (1992) 214–226.

Klicker, K.A. et al. "Composities of PZT and Epoxy for Hydrostatic Transducer Applications", Journal of the American Ceramic Society, vol. 64, No. 1, Jan 19, 1981, pp. 5–9.

(List continued on next page.)

*Primary Examiner*—William Krynski
*Assistant Examiner*—J. M. Gray
*Attorney, Agent, or Firm*—Fish & Richardson P.C.

[57] ABSTRACT

Composites for actuating or sensing deformation. In embodiments, the composites have a series of flexible, elongated piezoelectric fibers arranged in a parallel array with adjacent fibers separated by relatively soft polymer. The piezoelectric fibers have a common poling direction transverse to their axial extension. The composite further includes flexible conductive material along the axial extension of the fibers for imposing or detecting an electric field.

10 Claims, 5 Drawing Sheets

OTHER PUBLICATIONS

Skinner, D.P. et al., "Flexible Composite Transducers", Mat. Res. Bull., vol. 13, pp. 599–607, 1978.

Smith, W.A., "Modeling 1–3 Composite Piezoelectrics: Thickness–Mode Oscillations", IEEE Transactions on Ultrasonics, Ferroelectric, and Frequency Control, vol. 00, No. 0, 1990, pp. 1–11

Newnham, R.E. et al., "Connectivity and Piezoelectric–Pyroelectric Composites", Mat. Res. Bull., vol. 13 pp. 525–536, 1978.

Smith, W.A., "The Role of Piezocomposites in Ultrasonic Transducers", IEEE Ultrasonics Symposium, 1989 pp. 1–12.

Lee, Chih–Kung, "Piezoelectric Laminates for Torsional and Bending Modal Control: Theory and Experiment", Thesis, 1987.

Panthalingal, Nandakumar, "Piezoelectric Composites of PZT/Epoxy for Sensing and Actuating Torsional Motion", Thesis, 1992.

Hagood et al., "Improving Transverse Actuation of Piezoceramics using Interdigitated Surface Electrodes", Smart Structures and Materials, Hagood et al., eds., pp. 341–352, 1993.

David J. Waller et al., "Piezoelectric Lead Zirconate Titanate Ceramic Fiber/Polymer Composites", *Journal of the American Society,* Jun. 1992, vol. 75, No. 6, pp. 1648–1655.

Genlec, Epoxy Technology, Product data information, undated.

Microelectronic Manufacturing Testing Desk Manual 1985, p. 158.

Piezoelectric Ceramics ed. by van Randeraat & Setterington, Mullard Limited, London pp. 4–6, undated.

FIG. 5A

COMPOSITES FOR STRUCTURAL CONTROL

This is a continuation of application Ser. No. 08/229,574, filed Apr. 19, 1994, now abandoned.

FIELD OF THE INVENTION

This invention was made with government support under Grant Number N00014-92-J-4067 awarded by the Navy. The government has certain rights in the invention.

BACKGROUND OF THE INVENTION

Piezoelectric materials are materials that change their shape when they are exposed to an electric field. This phenomenon is caused by the repulsive or attractive interaction of the field with the electric dipoles in the material. The nature of the shape change is dependent on the direction of the electric field with respect to the "poling" direction of the piezoelectric material. The poling direction is the direction of the dipoles in the material, which is assigned as one of the three cartesian coordinate axes.

If the electric field is applied along the poling direction, the material expands or contracts along this axis (depending on the direction of the field relative to the direction of the poling). This is known as the primary or direct piezoelectric effect. At the same time the material is expanding or contracting in the poling direction, it is contracting or expanding along the axes that are orthogonal to the poling direction. These motions are known as the secondary or indirect piezoelectric effect. The amount of motion due to the primary effect is typically greater than the amount of motion due to the secondary effect. The amount of motion due to the secondary effect in the orthogonal axes is typically isotropic.

Another property of piezoelectric materials is that, converse to the application of an electric field to cause mechanical deformation, when mechanical force is applied to the material, it produces an electrical signal. The magnitude of the signal also depends on the poling direction axis, with electrical signal measured along the poling direction axis typically having a greater magnitude than the electrical signal measured along the other axes.

The poling direction of a piezoelectric material is selected during manufacture by subjecting a precursor material, e.g., a specific ceramic or ferroelectric material, to an initial large electrical field that causes the dipoles to become aligned. The material thereafter exhibits the piezoelectric effects described above when it is subject to smaller actuating fields or to mechanical forces.

Monolithic piezoelectric materials have been used in structural control as actuators or sensors. The materials can be bonded to or embedded in structural components, and then actuated by applying an electric field to deform the material and the structural component, or the material may be monitored to sense an electrical signal indicative of a mechanical force applied to the material and the structural component. For example, it has been suggested that piezoelectric materials could be incorporated in aircraft wings to detect and compensate for bending and vibration in the air foil caused by excessive lift and drag.

Many structural components, such as aircraft wings, are made of standard composite materials which are composed of relatively stiff reinforcing fibers, such as glass or carbon, embedded in a tough resin matrix. These composite materials must exhibit high strength, low weight, and resistance to environmental attack.

SUMMARY OF THE INVENTION

In a first aspect, the invention features a composite for actuating or sensing deformation. The composite has a series of flexible, elongated piezoelectric fibers arranged in a parallel array with adjacent fibers separated by relatively soft polymer. The piezoelectric fibers have a common poling direction transverse to their axial extension. The composite further includes flexible conductive material along the axial extension of the fibers for imposing or detecting an electric field.

In another aspect, the invention features a structural component that can be controlled to actuate or sense deformation. The structural component includes a structural material and, mechanically coupled thereto, a composite for actuating or sensing deformation. The control composite has a series of flexible, elongated piezoelectric fibers arranged in a parallel array with adjacent fibers separated by relatively soft polymer. The piezoelectric fibers have a common poling direction transverse to their axial extension. The composite further includes flexible conductive electrode material along the axial extension of the fibers for imposing or detecting electric fields.

In another aspect, the invention features a composite for actuating or sensing deformation. The composite has a series of flexible, elongated fibers capable of responding to an external stimulus by deforming or producing a signal indicative of the stimulus. The fibers are arranged in a parallel array with adjacent fibers separated by a select polymer. The composite further includes flexible material along the axial extension of the fibers for imposing the stimulus or detecting the signal.

Embodiments may include one or more of the following features. The composite is in a form having a length and width greater than the thickness and the axial extension of the fibers is along the length of the composite. The largest deformation of the composite upon imposing an electric field is substantially along the length of the composite. The width of the composite is substantially constant upon imposing the electric field. The composite is characterized by $|d_{32}/d_{31}|$ being in the range of about 0 to 0.9. The composite length and width are of at least about 10 times the thickness. The fibers are arranged as a single layer along the width. The composite thickness is substantially equal to the diameter of the fibers. The conductive material is in contact with the fibers along their length.

Embodiments may also include one or more of the following features. The composite is in a form where the length is about 6 mm or more. The fibers have a length of about 1 inch or more. The fibers extend continuously along the length. Adjacent fibers are separated by a distance equal to about 0.1 to 9 times the diameter of the fibers. The fibers are separated by about 1 to 1.5 times the diameter of the fibers. The fibers have a diameter in the range of about 5 to 200 microns. The fibers have a circular cross-section. The electrode material extends continuously along the length and width. The electrode material is etched in a pattern. The electrode material is accessible for electrical connection from the edge of the composite. The electrode material is arranged to apply an electric field along the poling direction of the fibers. The polymer has a modulus of elasticity of about 3–10 GPa. The polymer has Youngs modulus that is at least 5 times less than the Youngs modulus of the fibers.

Embodiments may also include one or more of the following features. The composite is embedded in the structural material. The electrode material is accessible from an edge of the structural component. The composite extends substantially over the width and length of the structural component. The structural component includes multiple layers of the composites oriented such that the motion of the composites upon application of electric fields collectively causes a desired deformation of the structural component. The structural material is isotropic and the composite layers are arranged to enable twisting of the structural component.

The inventions have many advantages. In embodiments, the piezoelectric effect exhibited by the composites is substantially anisotropic even though the piezoelectric fibers themselves exhibit motions in all directions. This feature allows the composites to be used as highly-directional actuators and sensors. Moreover, the anisotropic feature allows the composites to be oriented and used in combinations that allow controlled complex motions, such as twisting, even when the structural component is made substantially of isotropic materials such as metals.

In particular embodiments, the only significant actuating and sensing of the composite is in the direction of the axes of the fibers embedded in the polymer. For example, in the case of actuators, when the composite is exposed to an electric field, there is a relatively large net motion along the axes of the fibers because the fibers are relatively long, and because they all move in the same direction. The soft polymer in which the fibers are embedded stretches or contracts with the axial motion of the fibers. In particular embodiments, this large net motion is achieved even when caused by a secondary piezoelectric effect.

The fibers also expand or contract in the two orthogonal axes transverse to the fiber axes, but these motions are minimized in the composite. First, the magnitude of the transverse motions of the fibers are small compared to the axial motion since the diameter of the fibers is small compared to their length. Second, the effect of the transverse expansion and contraction of the fibers along one of the transverse axes is cancelled by the stretching and compression of the polymer. For example, in the case of a net expansion in the axial direction, the polymer is stretched, which causes it to become smaller in the transverse axes. The expansion of the fibers which occurs in one of the transverse axes is offset by this effect so that the composite exhibits little or no net change in dimension in this direction. The effect of the fiber motion in the other transverse axis, which would be a contraction in this example, is minimized by the construction and orientation of the composite. The composite is typically smallest along this axis, which preferably corresponds to the thickness of the composite. In a typical application, the composite is oriented with respect to the structural component so that actuation, such as bending, elongating or twisting, is achieved by the large axial motion of the composite, and the small changes in the thickness do not substantially effect the performance of the structural component.

Another advantage is that the piezoelectric fiber composites can be implemented in extended lengths and widths to cover a substantial portion of a large structural component. The electric field is imposed upon or sensed from the composite across its smallest dimension, typically corresponding to its thickness. This allows the composites to be poled and actuated at practical voltages (e.g., well under 10,000 V, e.g., around 1–2000 V) despite their large-area coverage. The thickness of the piezoelectric composite may be substantially equal to the diameter of the piezoelectric fibers, i.e., on the order of a few hundred microns or less, while the length and width may extend over many feet.

Moreover, the composites are easily connected to the control electronics even when they are embedded in a large structural component. In embodiments, the fields are imposed or sensed by thin flexible electrode layers that extend continuously over the length and width of the composite. These layers are easily accessed from the edge of the composite to allow connection of the composite to control electronics.

Another advantage is that the composites are mechanically robust. If the fibers fracture during use, the mechanical integrity of the composite is maintained by the polymer matrix. Moreover, since the electrode layers are continuous over the length and width of the composite, and since the piezoelectric effect does not require that the fibers be continuous, the composite can still be used for actuation and sensing even in the event of damage, e.g. fracture of the fibers.

The piezoelectric fiber composites are also compatible with standard structural composites, and can therefore become an integral part of a structural component without reducing its mechanical performance. The small diameter of the piezoelectric fibers increases the specific strength and conformability of the composite. Although the fibers are typically made of ceramic materials, the composite does not contribute excessive brittleness when it is incorporated in a structural component. The piezoelectrical fiber/polymer composite also provides load sharing properties exhibited by standard structural composites.

The piezoelectric fiber composites are also highly tailorable to particular applications by variation of anisotropic properties, mechanical properties, and actuation and sensing properties, through selection of variables such as the fiber diameter, fiber mechanical properties, fiber orientation, fiber spacing, polymer mechanical properties, polymer electrical properties, and composite orientation and implementation in the structural component.

Other features, aspects, and advantages follow. For example, the invention also features methods of use and methods of fabrication of the composites and structural components.

DESCRIPTION OF THE PREFERRED EMBODIMENTS

Structure and Operation

Figure 1:
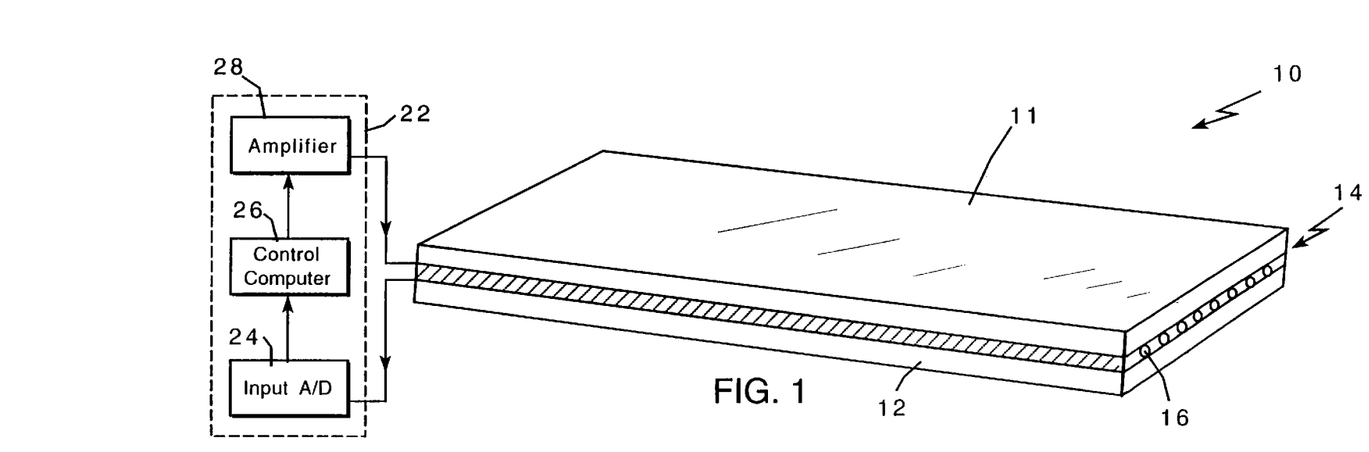
FIG. 1 is a perspective view of a structural component including a piezoelectric fiber composite in the field-off condition.
Figure 1A:
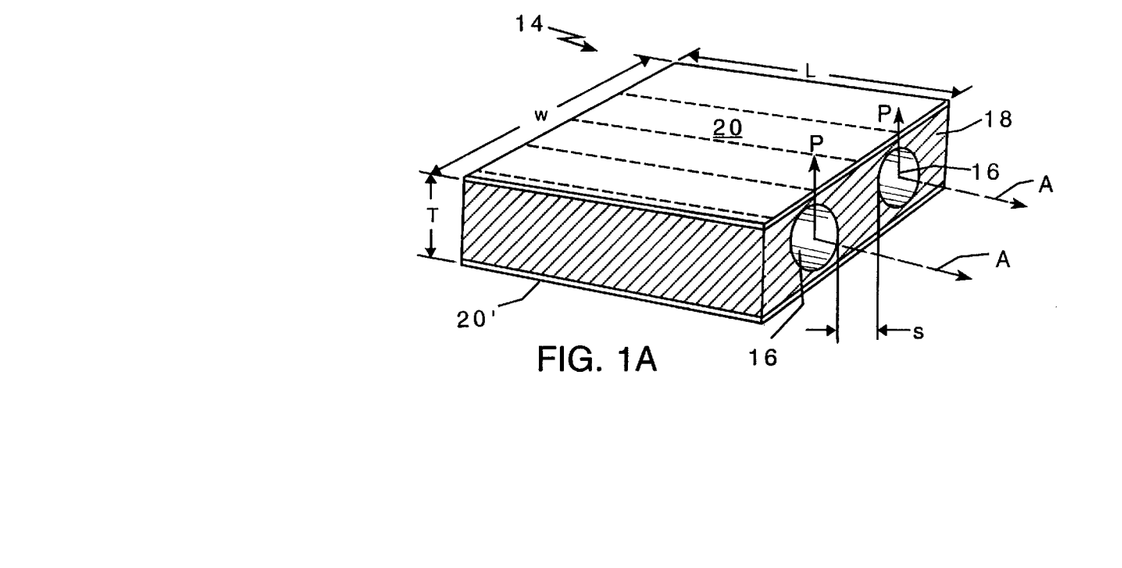
FIG. 1a is an enlarged perspective view of a portion of the piezoelectric fiber composite in FIG. 1.

Referring to FIGS. 1 and 1a, a structural component 10 has piezoelectric fiber composite 14 that spans its entire length and width and is embedded between an upper structural layer 11 and lower structural layer 12. The structural layers 11, 12 are made, for example, of standard carbon-fiber reinforced composite materials.

Referring particularly to FIG. 1a, the piezoelectric composite 14 includes a series of piezoelectric fibers 16 arranged in an array with their axes (A) parallel to each other and embedded in a polymer 18. The composite 14 also includes two opposing thin flexible metal electrode layers 20, 20' along the top and bottom faces of the composite. The layers 20, 20' are continuous along the length and width of the composite and cover the full axial extension of all of the fibers. The length (L) and width (W) of the composite are larger than its thickness (T), which is substantially equal to the diameter of the fibers in this example since the composite includes a single layer fiber array. The fibers have a common poling direction that is transverse to their axes and orthogonal to the plane of the electrode layers, which is the direction indicated by arrows (P) in FIG. 1a.

The piezoelectric fiber composite can be used as an actuator or a sensor. The composite 14 is coupled to a control unit 22 by making an electrical connection to the conductive electrode layers at the edge of the layers, which may be exposed at an edge of the structural component. The control unit 22 includes an analog-to-digital converter 24, to process electrical signals from the fiber composite layer or another detector (e.g., a strain gauge), a computer 26, to analyze the processed signal from the sensor, and an amplifier 28, which receives a signal from the computer and sends an actuating electrical signal to the piezoelectric fiber composite layer 16 to displace the structure 10. The magnitude, frequency, waveform, etc. of the actuating signal is determined based on the nature of the desired displacement for the particular application.

In FIGS. 1 and 1a, the piezoelectric fiber composite is in a "field-off" condition in which an electric field is not applied to the electrode layers 20, 20', and thus the piezoelectric fiber composite is not activated to deform the structural component 10. As illustrated, the structural component 10 is substantially planar.

Figure 2:
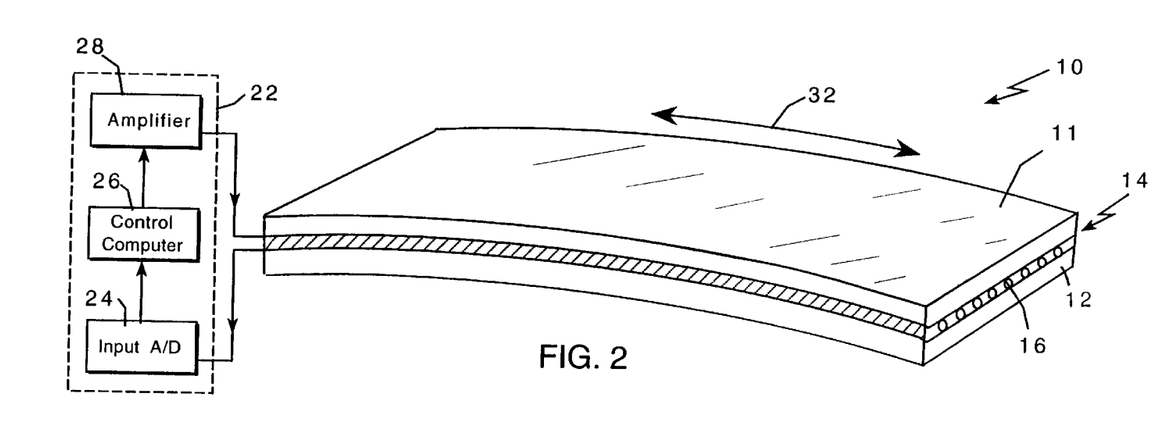
FIG. 2 is a perspective view of a structural component including a piezoelectric fiber composite in the field-on condition.
Figure 2A:
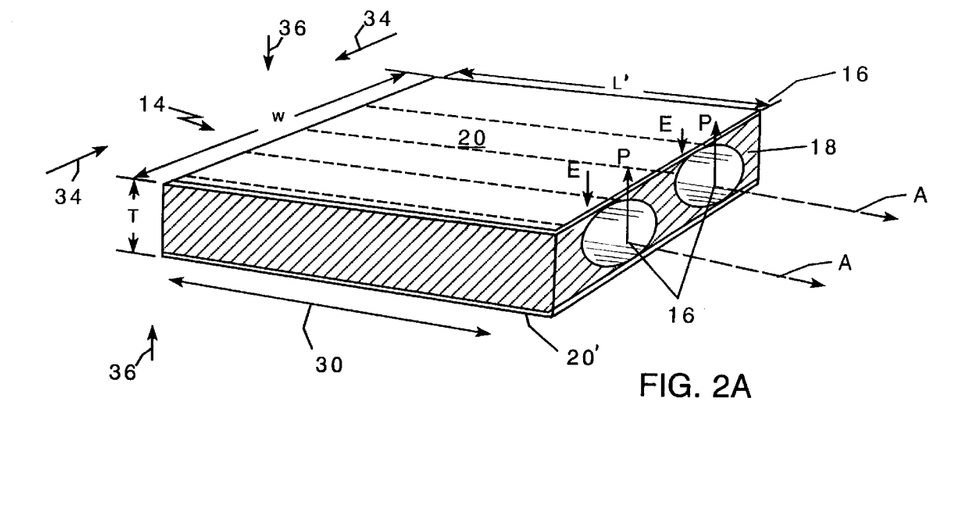
FIG. 2a is an enlarged perspective view of the piezoelectric fiber composite in FIG. 2.

Referring now to FIGS. 2 and 2a, the structural component and composite are illustrated in a "field-on" configuration, in which an electrical signal generated by the computer 20 is amplified and imposed on the conductive layers 20, 20' to actuate the piezoelectric fiber composite. The field in this case is oriented along the poling direction as illustrated by the arrow (E) in FIG. 2a. The field causes the piezoelectric fibers 16 to lengthen along their axes because of the secondary piezoelectric effect. The lengthening of the fibers causes the composite to lengthen, as indicated by arrow 30 in FIG. 2a, which forces the layers 11, 12 adhered to the composite, and thus the entire structural component to lengthen to (L'). In this embodiment the piezoelectric composite is placed between composite layers of unequal thickness. Thus, the thinner, more flexible top layer 11 stretches more than the thicker, stiffer bottom layer 12, which causes the structural component to lengthen and to bend, as illustrated by arrow 32 in FIG. 2.

A feature of particular composites is that the motion of the composite and the structural component is substantially anisotropic in the direction of the axes of the fibers even though the fibers themselves exhibit piezoelectric motion in other directions. This occurs because the composite minimizes the effect of the motion in these other directions.

Referring particularly to FIG. 2a, the application of the electric field also causes piezoelectric fibers 16 to contract along the axis parallel to the field (corresponding to the thickness (T)), due to the primary piezoelectric effect, and to expand in the axis that is perpendicular to the field and perpendicular to the axis of the fibers (corresponding to the width, (W)), due to the secondary piezoelectric effect. The motion of the composite due to these effects is small compared to the lengthening because the length of the fibers is large compared to their diameter. Moreover, the expansion motion in the direction perpendicular to the field and the fiber axes does not result in an increase in the width of the composite since the stretching of the composite along the axis of the fibers, indicated by arrow 30, causes a narrowing along the width of the polymer, as indicated by arrow 34, which cancels the effect of the expansion of the fibers in the composite.

The other motion of the fibers, a contraction motion parallel to the field and to the poling direction, results in a reduced thickness (T') in the composite, as illustrated by arrows 36. The thickness is the smallest dimension of the composite, however, and the magnitude of this motion is small compared to the elongation. Further, small changes in the thickness do not substantially effect actuations such as lengthening and bending that rely on the large axial motion of the composite. This anisotropic motion of the composite greatly enhances actuation and sensing in a desired direction and enables more complex motions by selection of the orientation of the composite with respect to the structural component, as will be discussed in more detail below. In preferred embodiments, the length and width of the composite are at least about 10 times the thickness.

The response of the composites to an applied electric field can be modeled with a series of linear equations. Following application of an electric field defined by the vector E, strain, defined by the tensor S, can be induced in all three dimensions (1,2, and 3, corresponding to the thickness, width and length in FIG. 1a) in the composite layer. The induced strain S is related to the magnitude and direction of the field E by the effective tensor $d^{eff}$:

$$S = d^{eff} E$$

where $d^{eff}$ contains non-zero elements $d_{3x}$, where 3 represents the direction of the poling field and x represents the direction in which strain is induced in the composite. The magnitude and sign of these elements are dependent on the properties (e.g. mechanical, electrical, coupling) of the individual materials making up the composite and the spacing and orientation of the piezoelectric fibers in the polymer.

When the actuating field is parallel to the direction of the poling field, displacements along this direction (i.e., x=3) are related to the magnitude of the effective $d_{33}$ tensor element. Displacements of the active composite layer along the 1 and 2 axes are related to the effective $d_{31}$ and $d_{32}$ tensor elements, respectively. Typically, for an applied field along the direction of poling, the expansion along the field is roughly three times the magnitude of displacements transverse to the field, i.e., $|d_{31}| \approx 1/3 |d_{33}|$. Application of the field also causes the fibers to extend in an in-plane direction, which in theory would cause the composite to extend along its width. However, because polymers typically have high Poisson ratios, the extension of the composite along the axes of the fibers causes the width of the composite to contract. Thus, induced displacements are anisotropic, being nearly exclusively along the axis of the fiber, making $d_{31} > d_{32}$. The magnitude of the ratio of $d_{32}$ to $d_{31}$ of the composites is typically between about 0 to 0.9.

For a field applied along the 3 direction, the strain induced along the three axes is described by a series of linear equations:

$$S_3 = d_{33}E_3$$

$$S_2 = d_{32}E_3$$

$$S_1 = d_{31}E_3$$

The mechanical displacements U in the active composite layer can then be determined by integrating the induced strain over the length l of the strained region. Assuming a constant strain, the displacement along each of the strained regions due to the application of an electric field becomes:

$$U_3 = l_3 S_3$$

$$U_2 = l_2 S_2$$

$$U_1 = l_1 S_1$$

This model is described in detail in Hagwood et. al, "Development of Piezoelectric Fiber Composites for Structural Actuation", paper no. 9301717, Proceedings of the 34th AIAA Structures, Structural Dynamics and Materials Conference, La Jolla, Calif., 1993, the contents of which are incorporated herein by reference.

The diameter of the piezoelectric fibers is typically between about 5–200 microns. Small diameter fibers are desirable because they result in thinner, more flexible, higher-strength composites that can operate at reduced voltages. The length of the fiber may be adjusted depending on the size of composite material being fabricated. The fibers are preferably continuous along the length of the composite, but in embodiments the fibers may be provided as short fiber fragments positioned in linear series to form a composite of desired length. An advantage of the composites is that they retain their ability to be actuated or to sense mechanical forces even if the fibers are fractured during use, since the piezoelectric effect of the fibers does not require that they be continuous. In embodiments, the fibers are 6 mm or more in length e.g. about 1.5 to 4 inches in length or more. Thin fibers made of the piezoelectric material PZT-5H (lead zirconium titanate) are available from CeroNova corporation, Hopedale, Mass. The fibers can be made of various other electro-ceramic materials including all members of the PZT family, lead niobate ($PbNbO_6$), lead titanate ($PbTiO_3$), barium titanate ($BaTiO_3$), electrostrictive materials, e.g. magnesium niobate ($MgNbO_6$), other lead-based ceramics doped with lanthanum, tin, or niobium, and shape-memory piezoelectric materials. Preferably, the piezoelectric actuation in the linear regime is at least 300 microstrain (i.e. the fiber elongates 300 parts per million of its total length). Operation outside the linear regime permits much longer actuation, e.g., to 1000 microstrain or more. The fiber geometry can also be varied. For example, the fibers may be formed with a square or rectangular cross section (e.g., by sanding or grinding fibers that initially have a circular cross section or by extruding fibers through a square die). In this case, the electrode layers make better contact with the fibers compared to fibers with circular cross sections and there is no dead space between the electrode layer and the fibers.

The fibers are spaced such that adjacent fibers are separated by a distance, s, (see FIG. 1a) of approximately 0.1–9, and more preferably 1–1.5, times the diameter of the fibers. (This corresponds to a line fraction of about 0.1–0.9, preferably 0.4–0.5. Line fraction is the fraction of fiber in the width direction; line fraction is discussed in Hagood et al., incorporated supra.) The anisotropy and flexibility of the composite is enhanced at larger fiber spacings. However, if the fibers are at excessive spacings, then the displacement along the axes of the fibers and the mechanical stiffness of the composite are reduced. The composite can be constructed to have net reduction in width upon elongation by selecting larger fiber spacings, e.g., in the range of about 8 to 9 times the diameter of the fibers. In addition to arranging the fibers adjacent to each other in the width direction, the composites may include arrays of fibers that are stacked in multiple layers along the thickness of the composite.

The polymer is soft and deformable. Preferably, the Youngs modulus is below about 50 GPa, e.g., about 3–10 GPa. The Youngs modulus of the polymer is preferably at least 5 or 10 times less than the Youngs modulus of the piezoelectric fibers, which for most materials is about 60 GPa. Polymers which may be used include thermosetting and thermoplastic families of polymers, including epoxies, polyimides and cross-linked polyimides, polyvinyl chlorides, polyethylenes, and active polymers that exhibit electro-mechanical coupling, e.g. polyvinyl difluoride (PVDF). Preferred embodiments include epoxy polymers which are chemically and mechanically compatible with the polymers in the host composite structures, i.e., the piezoelectric composite epoxy is bondable to the structural composite epoxy and has similar mechanical and electrical properties. The piezoelectric composite epoxy may be the same epoxy used in the structural composite. The polymer may also include additives to achieve desired elastic and dielectric properties. For example, to increase the dielectric constant of the polymer, high-dielectric-constant particles composed of graphite, metal, ceramic, or electroceramic materials may be added. The amount of polymer between the conductive layers and the fibers is minimized since the polymer can act as an insulating layer, which would require increasing the electric field in order to actuate the composite. Preferably, the conductive layers are in direct contact with the fibers. As discussed, in embodiments, the fibers may have a rectangular cross section with edges parallel to the conductive layers to allow contact along the entire side of a fiber and to decrease the dead space between the fiber and the electrode which is filled with polymer when fibers with circular cross sections are used.

The conductive electrode layers are relatively flexible. Thin metal layers are desirable because they do not restrain the composite or the structural component during actuation. Silver is preferred. Other metals which may be used include aluminum, copper, and gold, as well as non-metallic conductors such as conductive polymers. In embodiments, the electrode layers may be formed of a thin polymer substrate (0.0013 cm) coated with an ultra-thin layer of metal (2000–3000 Å). The electrodes may be etched in a pattern. In an embodiment, the electrodes may be provided in an "interdigitated" pattern in which case the positive and negative electrodes are spaced alternately on the same side of the composite. This arrangement allows an applied field to have components along the axis of piezoelectric fibers, which can enhance the piezoelectric effect in the fiber axis and the anistropy of the composites. Interdigitated electrodes are discussed in Hagood et al., "Improving Transverse Actuation of Piezoceramics Using Interdigitated Surface Electrodes", SPIE paper number 1917-25, Proceedings of the 1993 North American Conference on Smart Structures and Materials, Albuquerque, N. Mex., the entire contents of which are hereby incorporated by reference. The electrode layers may adhere directly to structural materials. Alternatively, a separate non-conductive adhesive polymer layer may be provided between the electrode layer and the structural materials.

The composites may be used in many structural components. For example, they may be used in aeroelastic structures for active control of composite wings to suppress "flutter" at high airspeeds by applying AC fields, thereby effectively increasing the top speed of an aircraft. The composites can be used for both sensing and actuation in a closed-loop configuration. Control may also be achieved in a static manner by applying DC fields, thereby allowing shape control of aircraft wings to change the lift and drag characteristics without using flaps. Other applications include modifying transmission and reflection of acoustic fields in aircraft, automobiles, etc. Another use is for active panels or hulls on submarines which absorb incoming sonar or outgoing noise. An active structural component can also allow for control of the turbulent fluid boundary layer, so that drag on a vehicle, such as an aircraft, may be reduced. Other applications include micro-positional control, such as that required in optical and machining applications, prosthetic devices, and robotics.

An advantage of the composites is tailorability to particular applications. For example, parameters, such as polymer composition, fiber spacing and orientation, and fiber size, can be adjusted to vary the collective properties of the composite. The anisotropic nature of piezoelectric displacement can be maximized by choosing a polymeric material and piezoelectric ceramic material which have large differences in their mechanical stiffnesses. The number of fibers, and their spacing and orientation in the polymer also affects the anisotropic characteristics of the actuation. Actuation can be enhanced, and essentially limited to one direction, if the fibers are restrained in directions transverse to their axes. This can be accomplished by reinforcing the polymer using stiff materials, such as steel or graphite fibers oriented along these directions.

In a particular example, a piezoelectric fiber composite includes 100 PZT-5H fibers having a diameter of about 120 $\mu$m and a length of about 3.8 cm. The fibers have a Youngs modulus of about 60 GPa and are separated by about 120 $\mu$m. The polymer is EPO TEK® epoxy, an epoxy commonly used for microelectronic applications (available from Epoxy Technologies, Billerica Mass.) which has a Youngs modulus of about 3 GPa. The electrode layers are silver with a thickness of about 3000 Å. The total thickness and length of the composite are about 120–150 $\mu$m and 2.5 cm, respectively. The Youngs modulus of the composite is about 20 GPa, and the dielectric constant of the composite is $\epsilon^o/\epsilon=$ 400. The fibers are poled transversely to their axial extension and perpendicular to the plane of the electrodes using a voltage of about 40–100 V/mil. An actuating voltage of 15 V/mil induces an axial displacement of about 300 microstrain, which can be measured using a mechanical strain gauge. The composite is also characterized by $d_{31}=-120E-12M/V$ and $d_{32}=20E-12M/V$.

Manufacture

Figure 3:
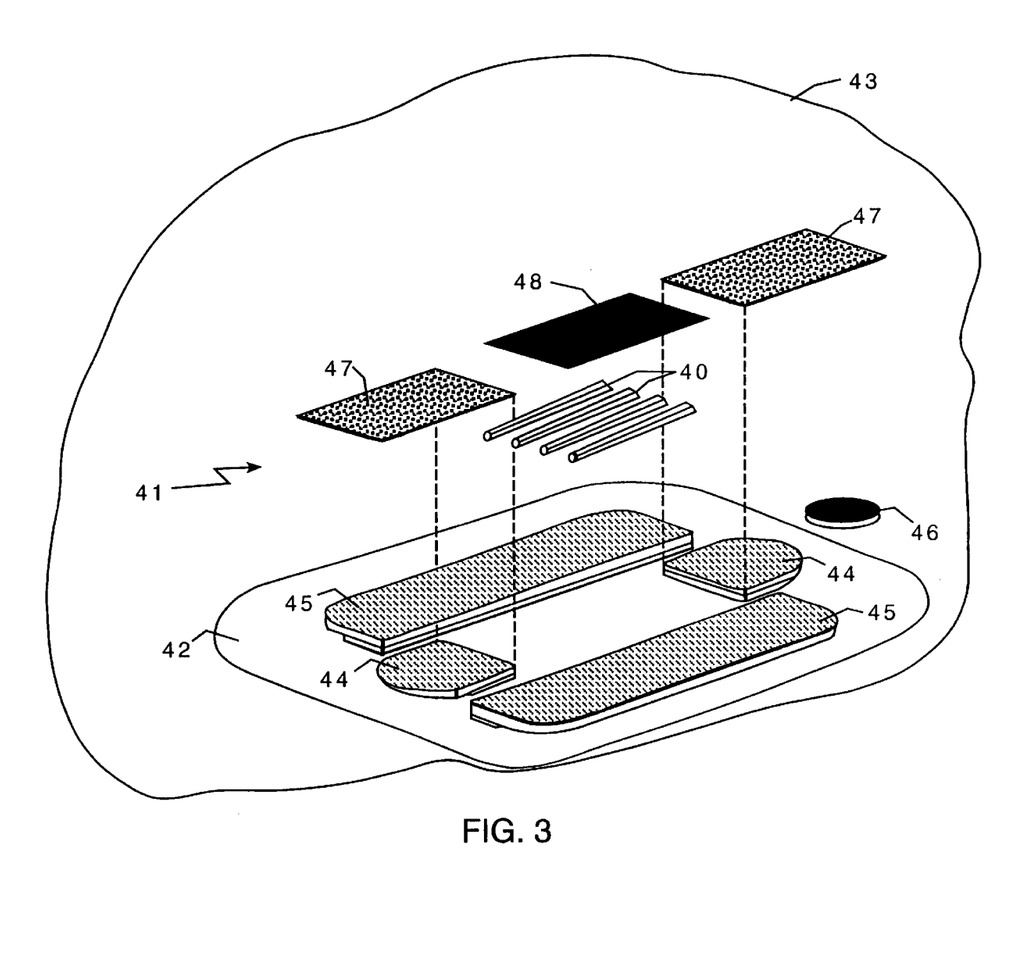
FIG. 3 is an exploded view illustrating fabrication of a piezoelectric fiber composite.

Referring now to FIG. 3, a conformable piezoelectric fiber composite can be manufactured by laying piezoelectric fibers 40 in a mold 41 supported by a sheet of non-porous teflon 42. The Piezoelectric fibers 40, composed of PZT-5H and having a diameter of 120 $\mu$m, and are placed equidistant and parallel to each other in the mold 41. A set of four metal plates are included in the mold 41 which are used to determine the dimensions of the composite. The metal plates can be fabricated from shim stock; changing the thickness of the shims allows the thickness of the composites to be tailored and the direction and flow rate of the epoxy to be adjusted. Accurate placement of the piezoelectric fibers 40 can be achieved by applying a thin, tacky, epoxy coating to the base of the non-porous teflon layer 42 and laying the fibers on the coating. Alternatively, a pair of machined metal combs with equally-spaced notches can be provided on the floor at each end of the mold. (The combs are removed from the mold following fiber placement.)

Following placement of piezoelectric fibers 40, the liquid phase of the matrix-forming material (i.e., an uncured resin solution), for example, an epoxy resin such as Epo-tek 301, is added to the mold 41 between the metal plates. Preferably, the height of metal plates 45 is slightly larger than the diameter of the fibers. The height of metal plates 44 is slightly less than that of the fibers in order to facilitate the flow of epoxy over these plates during the curing process. Flowing of the epoxy along this direction allows the spacing of the fibers to be maintained. In addition, sheets of porous teflon 47 are placed over metal plates 44 to allow removal of excess epoxy by absorbing epoxy that flows over from the mold. Following pouring, a final sheet of non-porous teflon 48 is placed over the mold 41 to facilitate removal of the composite from the mold after it is cured.

Curing is accomplished by heating the structure to a temperature and applying pressure for a time period appropriate for a particular polymer system. For example, for Epo-tek 301, exposure of the polymer to a temperature of 60° C. for a time period of about 1 hour is required for curing. (In an alternate embodiment, an epoxy may be used which allows manufacture of a composite left in a uncured state, i.e., a pre-impregnated composite. A piezoelectric fiber composite in this form may be stored for a period of time prior to being inserted into a host structural component, where it can be cured along with this material in a single step.)

The mold is provided in a flexible vacuum bag 48 that includes a vacuum port 46. When a vacuum is drawn in the bag, the bag collapses around the mold which allows compression during curing at a pressure about one atmosphere. In addition, the vacuum condition within the bag allows air bubbles to be removed from the epoxy prior to curing to insure maximum compaction. Typically, a vacuum of approximately 30 psi is applied to the system overnight without heat to minimize voids. It is desirable to keep void content in the composite to a minimum since the dielectric strength of epoxy and piezoelectric fibers is four to five times higher than that of air, and voids present locations across which the applied voltage may arc. High void concentrations in the composite may make it difficult to reach the poling voltages.

Following curing, the metal plates of the mold 41 are removed, and the resulting composite structure is removed from the mold and lightly sanded on the upper and lower surfaces. This allows the surfaces to be roughened to increase the adhesion of the electrode layer. In addition, sanding exposes the tops of the fibers, which allows the metal electrode layer to be in direct contact with the fiber. The electrode layer is provided by depositing silver by electron beam evaporation at low power. The low power is selected to reduce heat buildup that could warp the composite. For Epo-tek epoxy, the temperatures should be kept below about 100° C.

In an alternative embodiment, the electrode is provided by placing a polyimide sheet having one side coated with a thin (typically 2000–5000 Å) conducting metal film in the bottom of the mold 41 prior to pouring the epoxy and laying the fibers. Following pouring, a separate metal-coated polyimide sheet is placed on top of the epoxy, and the entire multi-layer structure is cured, allowing the epoxy to adhere to the electrode. Electrodes attached to the composite in this fashion have the advantage that they can be etched prior to being integrated into the composite structure, thus allowing the use of desired electrode patterns, such as interdigitated electrodes, which may enhance actuation of the composite.

Following curing, the piezoelectric fibers are poled by placing the composite structure into a hot oil bath, typically at a temperature of 80° C. The hot oil serves two functions: arcing and dielectric breakdown are reduced by the presence of the oil, and the heat facilitates alignment of the dipoles. Poling is typically carried out for 15 minutes at a voltage level typically on the order of 40 V/mil, with voltages and poling time periods being adjusted for composite structures having different thicknesses. The poling voltages may be higher in cases where the fiber has not been exposed by sanding. Following poling, the composite device can be activated by attaching the electrodes to a voltage source using wires or conductive tape. The composite can be attached to or embedded in a structural component.

Figure 4:
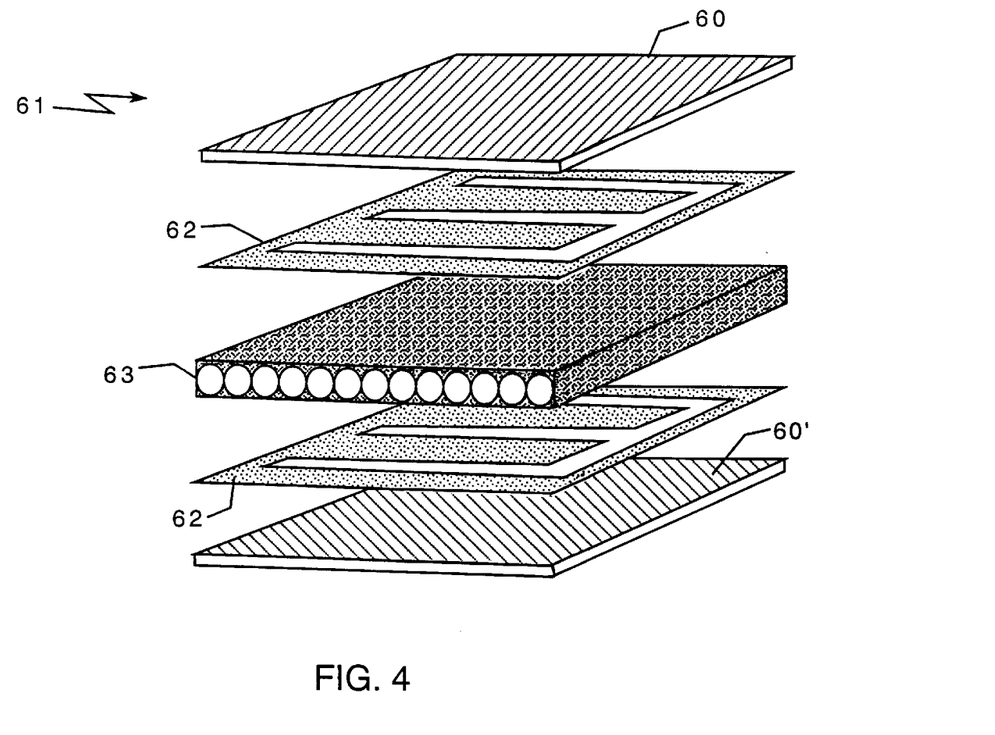
FIG. 4 is an exploded view illustrating fabrication of a structural component with a piezoelectric fiber composite.

Referring now to FIG. 4, in particular embodiments the composite is embedded in a structural component. A structural component can include a host material, provided as plies 60, 60' of material such as a graphite fiber/epoxy composite. The piezoelectric fiber composite 63 is sandwiched between the plies. The structural component can be formed by pre-forming the piezoelectric composite, placing it between the host layers, and then curing the host layers. Alternatively, the host layers and piezoelectric composite can be co-cured in a single step. The composite can also be pre-formed in a pre-impregnated form. In this case, a liquid epoxy is provided around the fibers and, in time, with the evaporation of volatile solvents in the epoxy, the epoxy becomes solid without curing. The pre-impregnated piezoelectric composite can then be stored and cured at a later date. The curing of the pre-impregnated piece can be carried out prior to embedding it in a structural piece, or concurrently with the curing of the structural piece.

Additional Embodiments

Figure 5:
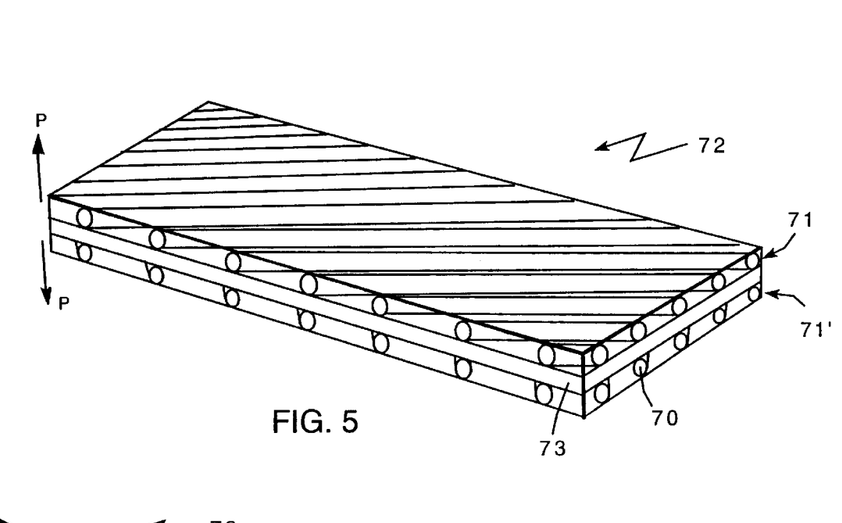
FIG. 5 is a perspective view of a structural component including piezoelectric fiber composites in the field-off condition.
Figure 5A:
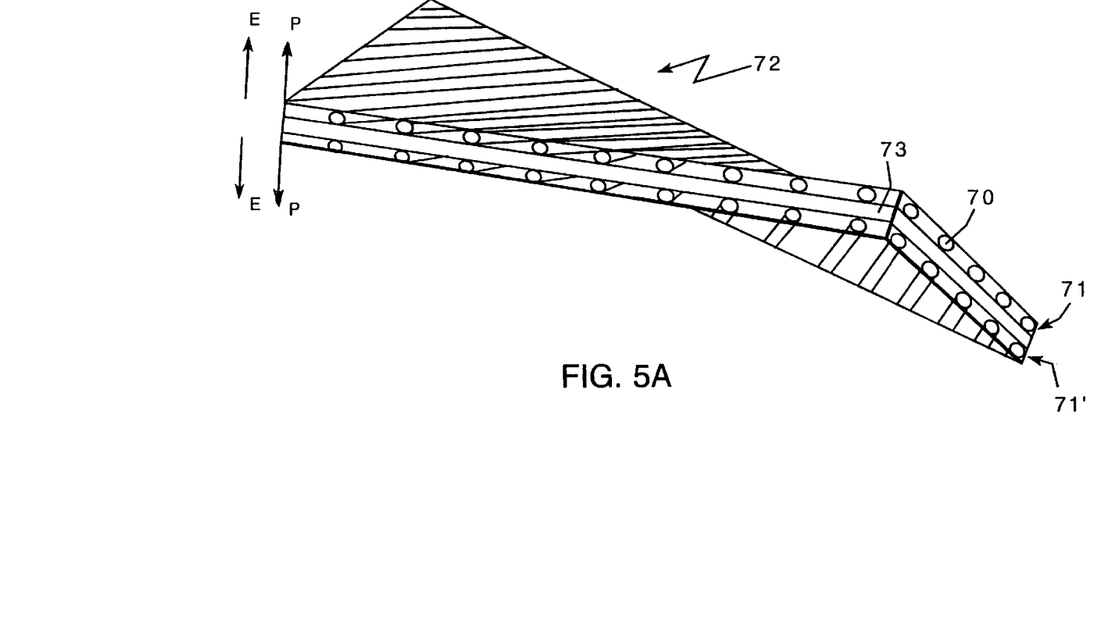
FIG. 5a is a perspective view of a structure including piezoelectric fiber composites in the field-on condition.

Referring now to FIGS. 5 and 5a, as discussed, the anisotropic nature of the composites can be used to control complex motions of structural components. In the embodiment illustrated, the composite layers 71, 71' sandwich a structural layer 73, which may be an isotropic material such as a metal. The upper composite layer 71 contains fibers oriented at +45° with respect to the substrate edge, while the lower composite layer 71' contains fibers oriented at −45°. The piezoelectric fibers 70 are poled in opposite directions in the layers 71, 71', as indicated in by arrows (P).

Referring now to FIG. 5a, when electrical fields are applied along the poling directions as indicated by arrows (E) (the "field-on" configuration), the structural component undergoes elongation and twisting because of the lengthening and torsional forces created by the elongation of the two composite layers along the axis of the fibers.

Additional deformations can be achieved by varying the orientation angle of the piezoelectric composites by varying the direction of the applied field with respect to the poling direction. For example, a bending and shear actuation can be achieved in the arrangement shown in FIG. 5 if the applied field is along the poling direction of the fibers in one composite layer, but opposed to the poling direction in the second layer. In another example, the composites are oriented such that the fibers of both composites are at +45°. In this case, a shearing and extension motion can be induced by applying the electric field in the same direction as the poling direction in both of the composite layers. A twisting and bending motion can be induced by applying the electric field in the same direction as the poling direction in one of the composite layers and applying the electric field in a direction opposite to the poling direction in the other composite layer.

More complex motions can be produced by varying the orientation of the layers and the number of layers. A particular advantage of the invention is that complex motions such as those described above can be induced in structural components using isotropic materials, such as metals, by using the combinations of piezoelectric layers with select actuation orientations. Deformations in these materials induced by piezoelectric active composites are further described in Bent et al., "Anisotropic Actuation with Piezoelectric Fiber Composites", Fourth International Conference on Adaptive Structures, November 1993, Cologne, Federal Republic of Germany, the entire contents of which is incorporated herein by reference.

In other embodiments, the principles set forth above to provide actuators with substantially anisotropic actuation can be used with materials that rely on actuation phenomena other than the piezoelectric effect. For example, shape-memory alloys can be provided in fiber form, arranged in parallel arrays, and embedded in a soft polymer matrix. In this case, the composites are actuated by a temperature change, which causes the shape-memory materials to undergo deformation. The deformation of the composite can be made to be substantially anisotropic by the arrangement of the fibers, which enhances motion in some directions, such as the direction along the axes of the fibers, and minimizes motion in other directions, such as the directions transverse to the fiber axes. Heat to actuate the superelastic materials can be provided in a direction transverse to the axes of the fibers by, for example, a resistive metal layer coated on the composite.

Other embodiments are in the following claims.

What is claimed is:

1. A composite for actuating or sensing deformation of a structural member, comprising:

a series of flexible, elongated electro-ceramic fibers arranged in a parallel array, each fiber substantially in parallel with each other, with adjacent fibers separated by relatively soft deformable polymer having additives to vary the electric or elasticity properties of the polymer, each fiber having a common poling direction, and said composite having a length and width greater than a thickness of the composite and axial extension of said fibers being along the length of said composite, said composite further including flexible conductive electrode material along the axial extension of said fibers for imposing or detecting electric fields, said electrode material having an interdigitated pattern forming electrodes of opposite polarity that are spaced alternately and configured to apply a field having compounds along the axis of the fibers, said polymer being interposed between said electrode and said fibers.

2. The composite of claim 1 wherein said additives increase the dielectric constant of the polymer.

3. The composite of claim 1 wherein the polymer has a Young's modulus of about 6 GPa.

4. The composite of claim 1 or 3 wherein the polymer has a Young's modulus that is at least five times less than the Young's modulus of the fibers.

5. The composite of claim 1 wherein said elongated electro-ceramic fibers comprise a piezoelectric material.

6. The composite of claim 1 wherein the fibers have a circular cross section.

7. The composite of claim 1 wherein the fibers have a rectangular cross section.

8. The composite of claim 1 wherein the additives are selected from the group consisting of graphite, metal, ceramic, and electro-ceramic materials.

9. The composite of claim 1 further comprising reinforcement fibers disposed within the polymer.

10. The composite of claim 9 wherein the reinforcement fibers are along the length of the composite and oriented transverse to the axial extension of the electro-ceramic fibers.

* * * * *